United States Patent
Kuwahara et al.

(10) Patent No.: US 9,041,436 B2
(45) Date of Patent: May 26, 2015

(54) SEMICONDUCTOR DEVICE HAVING PULL-UP CIRCUIT AND PULL-DOWN CIRCUIT

(75) Inventors: Shunji Kuwahara, Tokyo (JP); Hiroki Fujisawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 841 days.

(21) Appl. No.: 13/317,696

(22) Filed: Oct. 26, 2011

(65) Prior Publication Data

US 2012/0119578 A1 May 17, 2012

(30) Foreign Application Priority Data

Nov. 11, 2010 (JP) ................................. 2010-252677

(51) Int. Cl.
| | | |
|---|---|---|
| *H03K 3/00* | (2006.01) | |
| *G11C 11/4074* | (2006.01) | |
| *G11C 5/06* | (2006.01) | |
| *G11C 7/10* | (2006.01) | |
| *G11C 11/4093* | (2006.01) | |

(52) U.S. Cl.
CPC ............ *G11C 11/4074* (2013.01); *G11C 5/063* (2013.01); *G11C 7/1057* (2013.01); *G11C 11/4093* (2013.01)

(58) Field of Classification Search
USPC ......... 327/108–112, 170, 172–175, 427, 434, 327/437, 333; 326/81, 82, 83; 375/295; 365/189.05, 226, 189.11
See application file for complete search history.

(56) References Cited

U.S. PATENT DOCUMENTS 6,163,493 A * 12/2000 Yamagata et al. ............ 365/226
6,208,167 B1 * 3/2001 Ranjan et al. .................. 326/81

(Continued)

FOREIGN PATENT DOCUMENTS

JP 2000-124797 A 4/2000
JP 2001-110185 A 4/2001

(Continued)

OTHER PUBLICATIONS

Notification of Reason(s) for Refusal dated May 13, 2014, with English translation.

*Primary Examiner* — Lincoln Donovan
*Assistant Examiner* — Thomas Skibinski
(74) *Attorney, Agent, or Firm* — Kunzler Law Group, PC

(57) ABSTRACT

To reduce power supply noises occurring in a control circuit unit for controlling an output buffer. A semiconductor device includes unit buffers for driving a data output terminal, impedance control circuits for controlling the unit buffers, and a control circuit unit for controlling the impedance control circuits. The impedance control circuits and the control circuit unit operate by mutually-different power supplies, the control circuit unit supplies pull-up data and pull-down data in mutually reverse phase to the impedance control circuits, and the impedance control circuits convert the pull-up data and the pull-down data from reverse phase to in-phase and supply the same to the unit buffers. Thereby, a noise is difficult to occur in a power supply VDD used for the control circuit unit.

17 Claims, 10 Drawing Sheets

(56) References Cited

U.S. PATENT DOCUMENTS

| | | |
|---|---|---|
| 6,333,895 B1 | 12/2001 | Hamamoto et al. |
| 6,522,182 B2 | 2/2003 | Tomita et al. |
| 6,753,697 B2 * | 6/2004 | Nakase .................. 326/68 |
| 7,038,486 B2 | 5/2006 | Aoyama et al. |
| 7,279,933 B2 * | 10/2007 | Lee ........................ 326/82 |
| 7,317,333 B1 * | 1/2008 | Zhou et al. ............. 326/80 |
| 7,323,901 B2 | 1/2008 | Aoyama et al. |
| 7,809,864 B1 * | 10/2010 | Young et al. ........... 710/36 |
| 2002/0034103 A1 * | 3/2002 | Otsuka ................ 365/189.05 |
| 2003/0189477 A1 * | 10/2003 | Schafer et al. ......... 336/226 |
| 2006/0002222 A1 * | 1/2006 | Lee ....................... 365/226 |

FOREIGN PATENT DOCUMENTS

| | | |
|---|---|---|
| JP | 2003-229758 A | 8/2003 |
| JP | 2005-39549 A | 2/2005 |

* cited by examiner

SEMICONDUCTOR DEVICE HAVING PULL-UP CIRCUIT AND PULL-DOWN CIRCUIT

BACKGROUND OF THE INVENTION

1. Field of the Invention

The present invention relates to a semiconductor device, and particularly relates to a semiconductor device in which a power supply used for an output buffer is different from a power supply used for a control circuit unit for controlling the output buffer.

2. Description of Related Art

A semiconductor device such as DRAM (Dynamic Random Access Memory) is provided with an output buffer for outputting data outside a chip. Since a relatively large amount of current flows in the output buffer at one time, its operation causes a power supply noise. Thus, in many cases, the output buffer uses a dedicated power supply (VDDQ) that is separated from other power supply (VDD). In this case, a signal for controlling the output buffer is transmitted from a circuit using the power supply VDD to a circuit using the power supply VDDQ.

The output buffer is typically configured of a pull-up circuit for pulling up a data I/O terminal and a pull-down circuit for pulling down the data I/O terminal. In this case, the signal for controlling the output buffer is configured of pull-up data for controlling the pull-up circuit and pull-down data for controlling the pull-down circuit. Typically, the pull-up circuit is formed of P-channel MOS transistors and the pull-down circuit is formed of N-channel MOS transistors. Thus, when high-level data is output from the data I/O terminal, both the pull-up data and the pull-down data are at a low level, and when low-level data is output from the data output terminal, both the pull-up data and the pull-down data are at a high level. That is, the signals are in phase.

However, since the in-phase signal easily causes the power supply noise, there occurs a problem that when the pull-up data and the pull-down data are transmitted in phase in a circuit block using the power supply VDD, jitters of the power supply VDD increase. This problem is serious when an impedance of the power supply VDD is relatively high.

As a solution for the problem, there may be employed a method for transmitting the pull-up data and the pull-down data in reverse phase in the circuit block using the power supply VDD as described in Japanese Patent Application Laid-Open No. 2001-110185. With the method, the jitters of the power supply VDD can be reduced.

However, in the semiconductor device described in Japanese Patent Application Laid-Open No. 2001-110185, the pull-up data and the pull-down data are converted from reverse phase to in-phase in the circuit block using the power supply VDD and the signals converted into in-phase are supplied to the output buffer. Therefore, there is a section in which the pull-up data and the pull-down data are transmitted in phase in the circuit block using the power supply VDD. The power supply noise easily occurs in the section.

This problem is not so serious when the output buffer is configured of a small number of transistors as in Japanese Patent Application Laid-Open No. 2001-110185. However, when the output buffer is configured of a large number of transistors connected in parallel like an output buffer having an impedance adjustment function, since a load in the final stage of the circuit block using the power supply VDD is so heavy, the in-phase pull-up and pull-down data in this loaded section is a major cause for the power supply noise. Further, when the unit buffers each having the impedance adjustment function are connected in parallel thereby to enable an impedance to be selected, the above problem is more serious as a result of further increase of the number of transistors connected in parallel.

SUMMARY

In one embodiment, there is provided a semiconductor device that includes: a data output terminal; first and second power supply lines each supplied with a first power supply potential, the first and second power supply lines being separated from each other; third and fourth power supply lines each supplied with a second power supply potential, the third and fourth power supply lines being separated from each other; a first driver coupled between the data output terminal and the first power supply line; a second driver coupled between the data output terminal and the third power supply line; a first control circuit unit coupled between the first and the third power supply lines, the first control circuit unit supplying the first driver with a first signals and supplying the second driver with a second signals that is in phase to the first signals; and a second control circuit unit coupled between the second and the fourth power supply lines, the second control circuit unit supplying the first control circuit unit with a third signal that is in phase to the first signal and a fourth signal that is complementary to the first signal, the first circuit unit receiving the third and the fourth signals, outputting the first signal in response to the third signal, and outputting the second signal in response to the fourth signal.

In another embodiment, there is provided a semiconductor device that includes: a data output terminal; a pull-up circuit connected between the data output terminal and a first high-potential power supply line; a pull-down circuit connected between the data output terminal and a first low-potential power supply line; a first control circuit unit that controls the pull-up circuit and the pull-down circuit, the first control circuit unit operating on a first voltage appearing between the first high-potential power supply line and the first low-potential power supply line; and a second control circuit unit that controls the first control circuit unit, the second control circuit unit operating on a second voltage appearing between a second high-potential power supply line different from the first high-potential power supply line and a second low-potential power supply line different from the first low-potential power supply line, wherein the second control circuit unit transmits a first signal that controls the pull-up circuit and a second signal that controls the pull-down circuit in mutually-reverse phase, and supplies the first and second signals in reverse phase to the first control circuit unit, and the first control circuit unit converts the first and second signals in mutually-reverse phase into in-phase, and transmits and supplies the first and second signals converted into in-phase to the pull-up circuit and the pull-down circuit, respectively.

In still another embodiment, there is provided a semiconductor device that includes: a data output terminal; a first buffer circuit including an adjustable first impedance and coupled to the data output terminal to drive the data output terminal to a first logic level; a second buffer circuit including an adjustable second impedance and coupled to the data output terminal to drive the data output terminal to a second logic level; a control circuit unit that generates a first control signal to activate or deactivate the first buffer circuit and a second control signal, that is complementary to the first control signal, to activate or deactivate the second buffer circuit; and an impedance control circuit receiving the first and the second control signals, supplying a third signal to the first buffer circuit to adjust the first impedance in response to the first control signal and supplying a fourth signal to the second buffer circuit to adjust the second impedance in response to the second control signal, the third control signal being in phase to the fourth control signal.

According to the present invention, the first and second signals are transmitted in reverse phase in the second control circuit unit and the first and second signals are supplied in the reverse phase to the first control circuit unit so that a noise does not easily occur in the power supply used in the second control circuit unit. Therefore, even when the output buffer is configured of a large number of transistors, the power supply jitters can be reduced.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
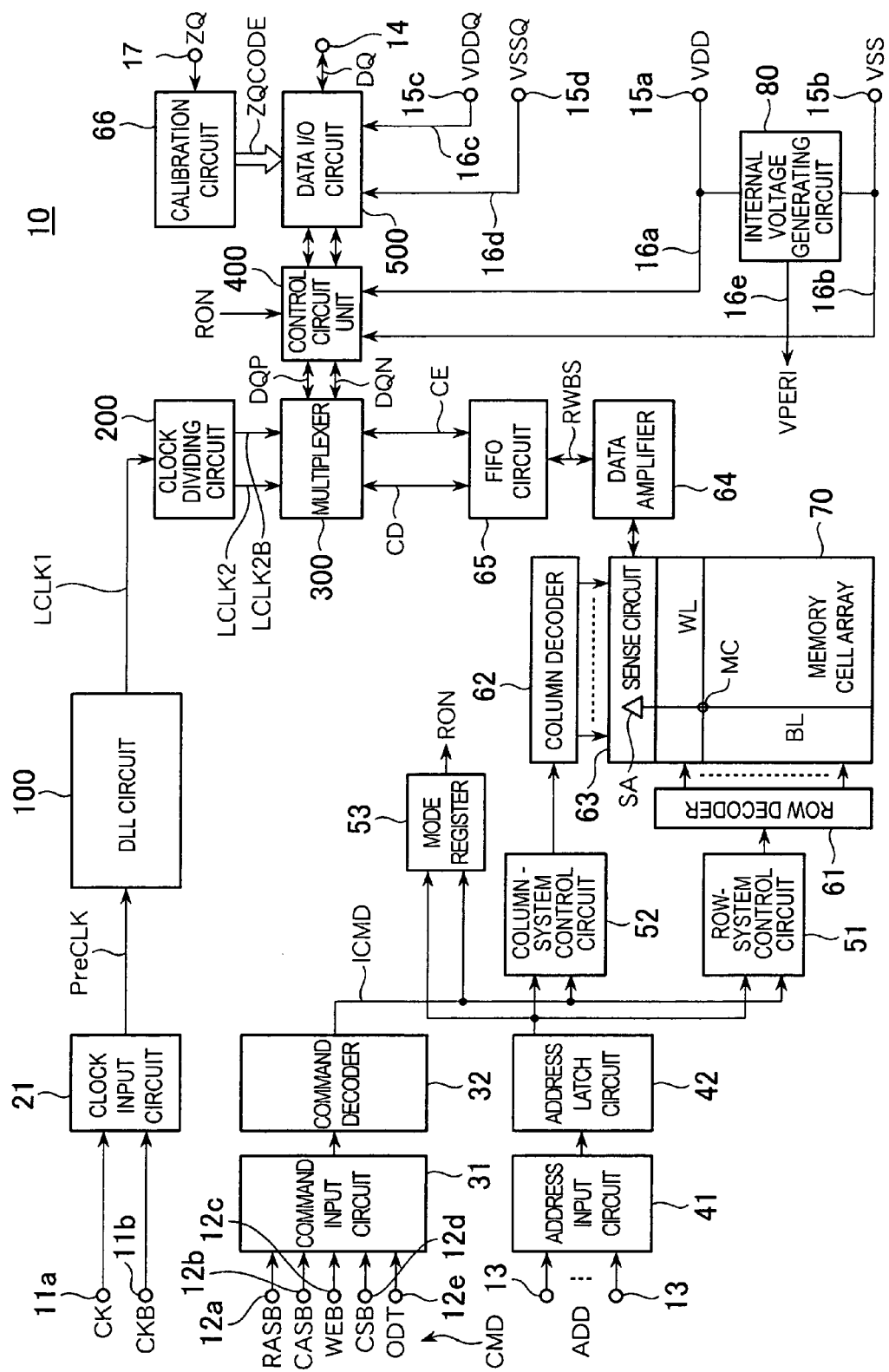
FIG. 1 is a block diagram showing a structure of a semiconductor device 10 according to a first preferred embodiment of the present invention.

FIG. 1 is a block diagram showing a structure of a semiconductor device 10 according to a first preferred embodiment of the present invention.

The semiconductor device 10 according to the present embodiment is a DDR (Double Data Rate) type SDRAM, and includes clock terminals 11a and 11b, command terminals 12a to 12e, address terminals 13, a data I/O terminal (data output terminal) 14, power supply terminals 15a to 15d and a calibration terminal 17 as external terminals. Additionally, data strobe terminals, a reset terminal and the like are provided but are omitted from the drawings.

The clock terminals 11a and 11b are to be supplied with external clock signals CK and CKB, respectively. The external clock signals CK and CKB are supplied to a clock input circuit 21. In the specification, a signal with its signal name followed by "B" means an inverted signal or low-active signal of a corresponding signal. Thus, the external clock signals CK and CKB are complementary to each other. The clock input circuit 21 generates a single-phase internal clock signal PreCLK based on the external clock signals CK and CKB and supplies it to a DLL circuit 100. The DLL circuit 100 generates a phase-controlled internal clock signal LCLK1 based on the internal clock signal PreCLK and supplies it to a clock dividing circuit 200. The clock dividing circuit 200 generates complementary internal clock signals LCLK2 and LCLK2B from the single-phase internal clock signal LCLK1 and supplies them to a multiplexer 300.

The command terminals 12a to 12e are to be supplied with a row address strobe signal RASB, a column address strobe signal CASB, a write enable signal WEB, a chip select signal CSB and an on-die termination signal ODT, respectively. These command signals CMD are supplied to a command input circuit 31. The command signals CMD supplied to the command input circuit 31 are supplied to a command decoder 32. The command decoder 32 is a circuit for generating various internal commands ICMD by holding, decoding and counting the command signals. The internal commands ICMD are supplied to a row-system control circuit 51, a column-system control circuit 52 and a mode register 53.

The address terminals 13 are to be supplied with address signals ADD. The address signals ADD input into the address terminals 13 are supplied to an address latch circuit 42 via an address input circuit 41 to be latched in the address latch circuit 42. Row addresses in the address signals ADD latched in the address latch circuit 42 is supplied to the row-system control circuit 51 and column addresses are supplied to the column control circuit 52. When entering a mode register set operation, the address signals ADD are supplied to the mode register 53 so that the contents of the mode register 53 are updated.

Output signals of the row-system control circuit 51 are supplied to a row decoder 61. The row decoder 61 is a circuit for selecting any word line WL included in a memory cell array 70. In the memory cell array 70, a plurality of word lines WL and a plurality of bit lines BL are crossed and a memory cell MC is arranged at each intersection therebetween (FIG. 1 shows only one word line WL, one bit line BL, and one memory cell MC). A pair of bit lines BL is connected to corresponding one of sense amplifiers SA in a sense circuit 63.

Output signals of the column-system control circuit 52 are supplied to a column decoder 62. The column decoder 62 is a circuit for selecting any sense amplifier SA included in the sense circuit 63. The sense amplifier SA selected by the column decoder 62 is connected to a data amplifier 64. The data amplifier 64 further amplifies read data which has been amplified by the sense amplifier SA during a read operation, and supplies the read data to a FIFO circuit 65 via a read/write bus RWBS. On the other hand, during a write operation, the data amplifier 64 amplifies write data supplied from the FIFO circuit 65 via the read/write bus RWBS and supplies the write data to the sense amplifier SA. As shown in FIG. 1, the FIFO circuit 65 is connected to the multiplexer 300.

The data I/O terminal 14 is an external terminal for outputting read data DQ to outside and receiving write data DQ from outside. The data I/O terminal 14 is connected to a data I/O circuit 500. The data I/O circuit 500 is connected to the multiplexer 300 via a control circuit unit 400, and drives the data I/O terminal 14 based on the read data DQ supplied from the multiplexer 300 via the control circuit unit 400 during the read operation. Only one data I/O terminal 14 is shown in FIG. 1 but the number of data I/O terminals 14 is not necessarily limited to one, and a plurality of data I/O terminals 14 may be provided. In the present invention, the control circuit unit 400 may be called "second control circuit unit."

The power supply terminals 15a and 15b are to be supplied with an external power supply potential VDD and a ground potential VSS, respectively. In the specification, a voltage between the external power supply potential VDD and the ground potential VSS may be simply called "external voltage VDD." The external voltage VDD is supplied to an internal voltage generating circuit 80. The internal voltage generating circuit 80 generates an internal power supply potential VPERI lower than the external power supply potential VDD (VDD>VPERI). In the specification, a voltage between the internal power supply potential VPERI and the ground potential VSS may be simply called "internal voltage VPERI." The power supply terminals 15c and 15d are to be supplied with an external power supply potential VDDQ and a ground potential VSSQ, respectively. In the specification, a voltage between the external power supply potential VDDQ and the ground potential VSSQ may be simply called "external voltage VDDQ."

In the present embodiment, the external power supply potential VDDQ is equal to the external power supply potential VDD in level and the external power supply potential VSSQ is equal to the external power supply potential VSS in level. However, the power supply terminals 15a and 15c are separate on a chip, and a VDD line (high-potential power supply line) 16a connected to the power supply terminal 15a is not connected to a VDDQ line (high-potential power supply line) 16c connected to the power supply terminal 15c in the chip. Similarly, a VSS line (low-potential power supply line) 16b connected to the power supply terminal 15b is not connected to a VSSQ line (low-potential power supply line) 16d connected to the power supply terminal 15d in the chip. These power supply lines are separated as described above in order to prevent a power supply noise occurring due to the operation of the data I/O circuit 500 from propagating to other circuits. Since the data I/O circuit 500 flows a relatively large current by switching, the VDDQ line 16c and the VSSQ line 16d are designed to have a lower impedance than the VDD line 16a and the VSS line 16b. This is accomplished by making the numbers of power supply terminals 15c and 15d larger than the numbers of power supply terminals 15a and 15b.

As shown in FIG. 1, the VDD line 16a and the VSS line 16b are connected to the control circuit unit 400 and the VDDQ line 16c and the VSSQ line 16d are connected to the data I/O circuit 500. This means that the control circuit unit 400 operates on the voltage (external voltage VDD) between the external power supply potential VDD and the ground potential VSS and the data I/O circuit 500 operates on the voltage (external voltage VDDQ) between the external power supply potential VDDQ and the ground potential VSSQ.

The data I/O circuit 500 is further connected to a calibration circuit 66. The calibration circuit 66 is connected to the calibration terminal 17 and serves to adjust an impedance of the output buffer included in the data I/O circuit 500. The calibration circuit 66 generates an impedance code ZQCODE by the calibrating operation and supplies the impedance code ZQCODE to the data I/O circuit 500. The data I/O circuit 500 changes the impedance of the output buffer based on the impedance code ZQCODE.

The adjustment of the impedance by the calibration circuit 66 is directed for preventing the impedance of the output buffer from deviating from a set value due to a change in temperature or a variation in voltage, and the set value itself of the impedance can be changed by a set value of the mode register 53. The set value of the impedance set in the mode register 53 is supplied as an impedance setting code RON to the control circuit unit 400.

The internal voltage VPERI is supplied to most of other peripheral circuits, which operate with the power supply at the internal voltage VPERI. In other words, most peripheral circuits are connected to a VPERI line 16e and the VSS line 16b to operate at the internal voltage VPERI given by these lines. The VSS line 16b connected to most peripheral circuits and the VSS line 16b connected to the control circuit unit 400 are short-circuited inside the chip. In this way, most peripheral circuits are driven by the lower internal voltage VPERI, thereby reducing power consumption. In the memory cell array 70, an array voltage (VARAY), a high voltage (VPP) exceeding the external voltage VDD, a negative voltage (VKK) and the like may be used, but do not directly relate to the spirit of the present invention and an explanation thereof will be omitted.

Figure 2:
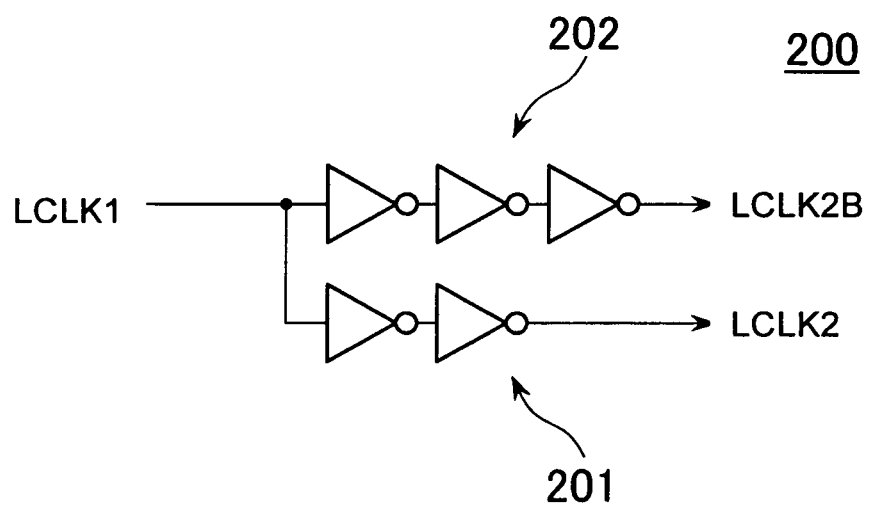
FIG. 2 is a circuit diagram of a clock dividing circuit.

FIG. 2 is a circuit diagram of the clock dividing circuit 200.

As shown in FIG. 2, the clock dividing circuit 200 has a path 201 in which even-numbered inverters are connected in series and a path 202 in which odd-numbered inverters are connected in series. The internal clock signal LCLK1 as the output of the DLL circuit 100 is supplied to both paths, the internal clock signal LCLK2 is output from the path 201 and the internal clock signal LCLK2B is output from the path 202. The path 201 and the path 202 are different from each other in the number of inverter stages, but are designed such that their eventual signal delay times coincide with each other. Thus, the internal clock signals LCLK2 and LCLK2B are exactly complementary to each other.

Figure 3:
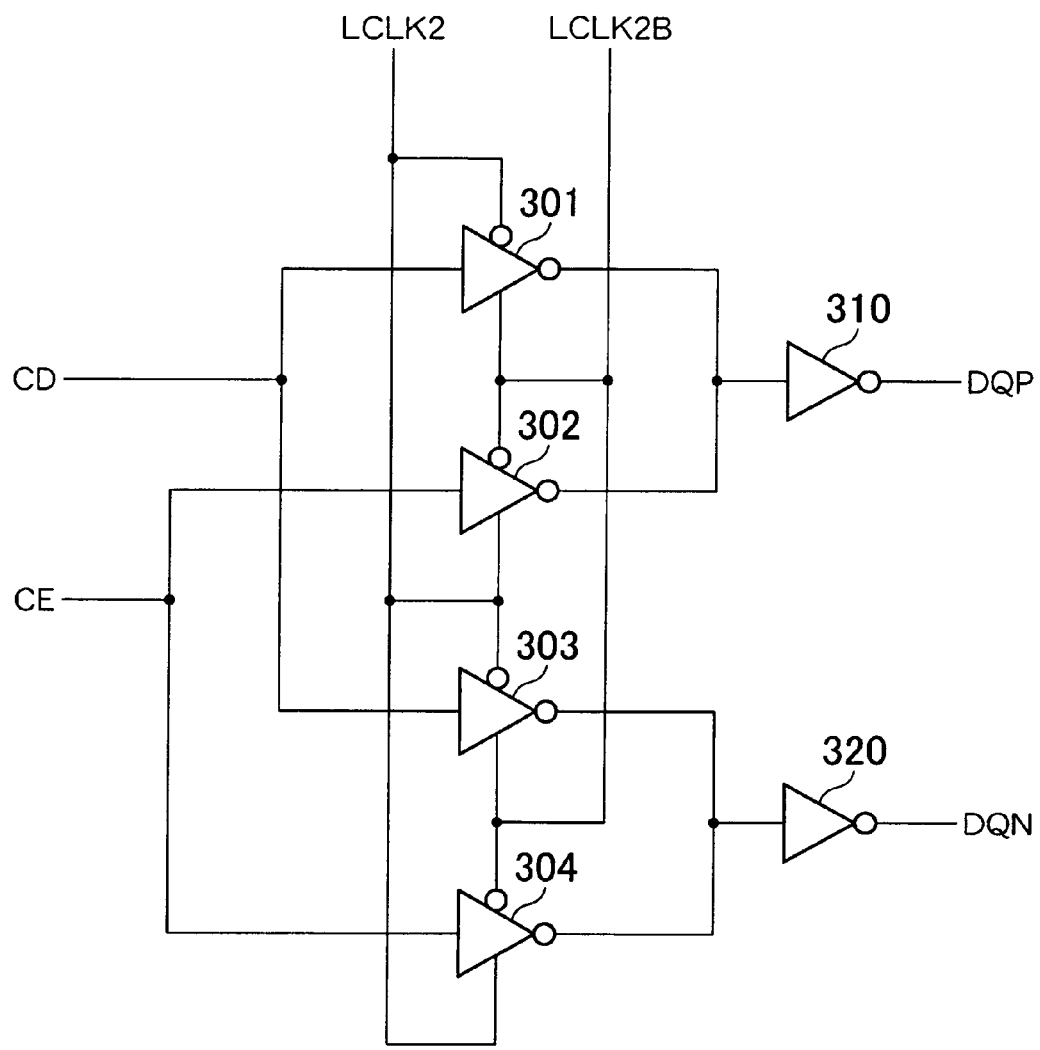
FIG. 3 is a circuit diagram of a multiplexer 300.

FIG. 3 is a circuit diagram of the multiplexer 300.

As shown in FIG. 3, the multiplexer 300 includes clock drivers 301, 303 for outputting an internal data signal CD supplied from the FIFO circuit 65 in synchronization with a rise edge of the internal clock signal LCLK2B, and clock drivers 302, 304 for outputting an internal data signal CE supplied from the FIFO circuit 65 in synchronization with a rise edge of the internal clock signal LCLK2. The output signals of the clock drivers 301 and 302 are output as pull-up data DQP via an inverter 310. The output signals of the clock drivers 303 and 304 are output as pull-down data DQN via an inverter 320.

Figure 4:
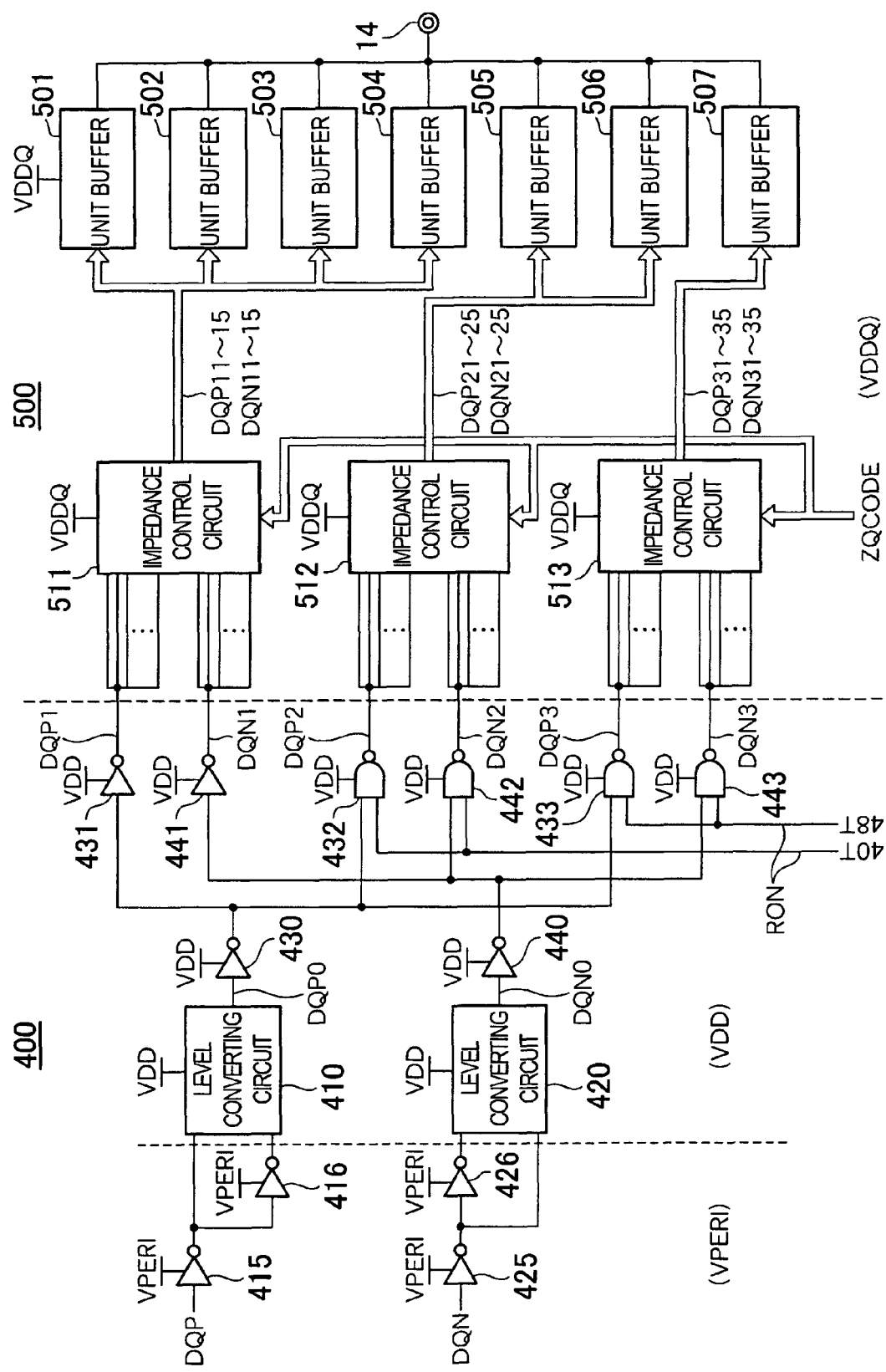
FIG. 4 is a block diagram of a control circuit unit 400 and a data I/O circuit 500.

FIG. 4 is a block diagram of the control circuit unit 400 and the data I/O circuit 500.

As shown in FIG. 4, the control circuit unit 400 includes a level converting circuit 410 for converting an amplitude of the pull-up data DQP from VPERI to VDD and a level converting circuit 420 for converting an amplitude of the pull-down data DQN from VPERI to VDD. Thus, a circuit block before the level converting circuits 410 and 420 uses VPERI as the power supply and a circuit block after the level converting circuits 410 and 420 uses VDD as the power supply. Pull-up data DQP0 level-converted by the level converting circuit 410 is supplied as pull-up data DQP1 to DQP3 to the data I/O circuit 500 via gate circuits 430 to 433. Similarly, pull-down data DQN0 level-converted by the level converting circuit 420 is supplied as pull-down data DQN1 to DQN3 to the data I/O circuit 500 via gate circuits 440 to 443. The circuits subsequent to the level converting circuits 410 and 420 among the respective circuits configuring the control circuit unit 400 operate on the voltage between the external power supply potential VDD and the ground potential VSS.

Figure 5A:
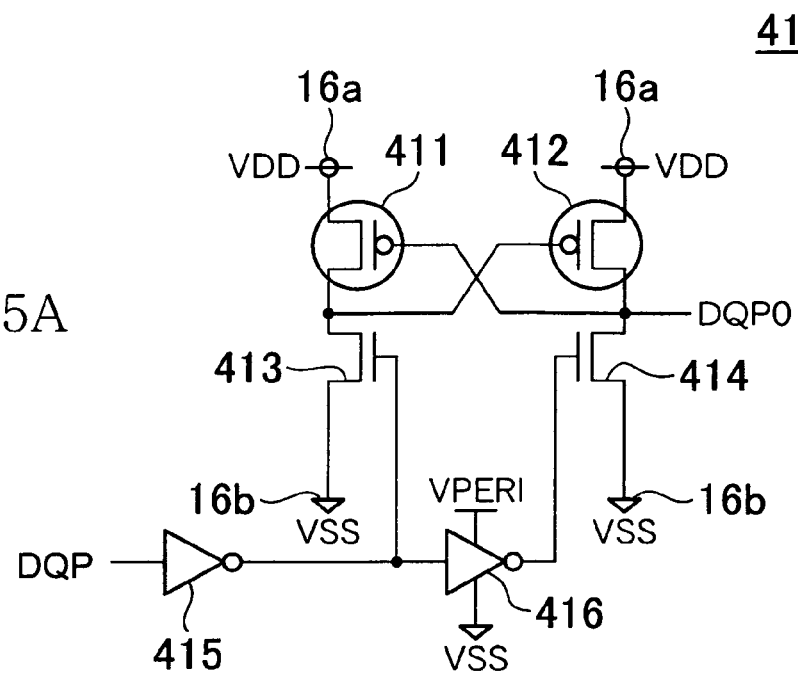
FIG. 5A is a circuit diagram of a level shift circuit 410.
Figure 5B:
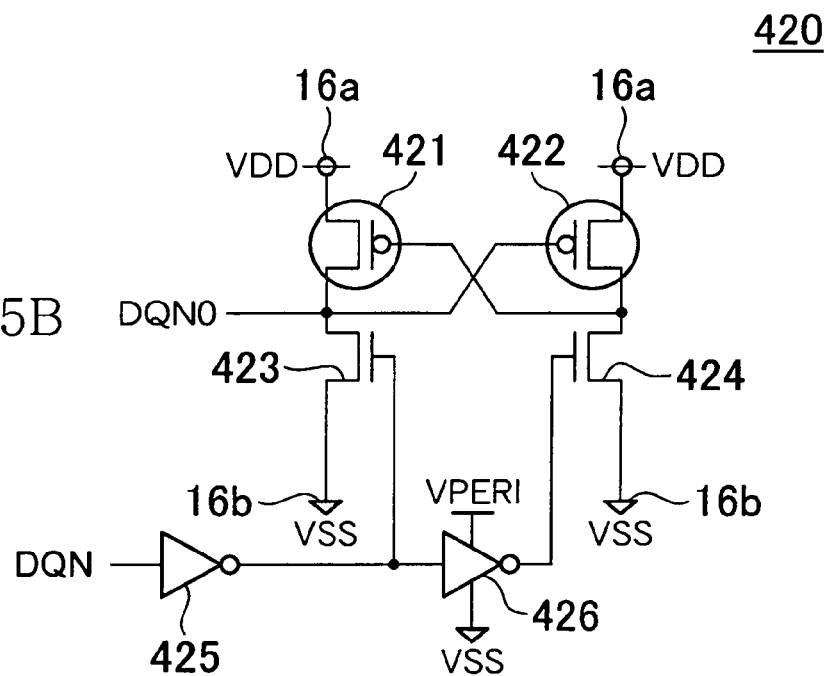
FIG. 5B is a circuit diagram of a level shift circuit 420.

FIG. 5A is a circuit diagram of the level shift circuit 410 and FIG. 5B is a circuit diagram of the level shift circuit 420.

As shown in FIG. 5A, the level shift circuit 410 includes P-channel MOS transistors 411 and 412 whose sources are connected to the VDD lines 16a and which are cross-coupled, and N-channel MOS transistors 413 and 414 whose sources are connected to the VSS lines 16b and which are connected to the transistors 411 and 412 in series, respectively. A gate electrode of the transistor 413 is supplied with the pull-up data DQP routed via an inverter 415 and a gate electrode of the transistor 414 is supplied with the pull-up data DQP routed via inverters 415 and 416.

The level shift circuit 420 also has the similar circuit structure. Specifically, as shown in FIG. 5B, the level shift circuit 420 includes P-channel MOS transistors 421 and 422 whose sources are connected to the VDD lines 16a and which are cross-coupled, and N-channel MOS transistors 423 and 424 whose sources are connected to the VSS lines 16b and which are connected to the transistors 421 and 422 in series, respectively. A gate electrode of the transistor 423 is supplied with the pull-down data DQN routed via an inverter 425 and a gate electrode of the transistor 424 is supplied with the pull-down data DQN routed via inverters 425 and 426.

The level converting circuits 410 and 420 are reverse to each other in the position of output port. Specifically, the converted pull-up data DQP0 is extracted from the connection point between the transistors 412 and 414 in the level converting circuit 410 while the pull-down data DQN0 is extracted from the connection point between the transistors 421 and 423 in the level converting circuit 420. Thus, the pull-up data DQP and the pull-down data DQN to be input are the in-phase signals while the pull-up data DQP0 and the pull-down data DQN0 to be output are the mutually reverse phase signals.

The pull-up data DQP0 and the pull-down data DQN0 are always propagated in the reverse phase state in the control circuit unit 400. Thereby, noises occurring in the VDD lines 16a and the VSS lines 16b due to the operation of the control circuit unit 400 are reduced. In the present invention, importantly, the pull-up data DQP1 to DQP3 and the pull-down data DQN1 to DQN3 are supplied in reverse phase to the data I/O circuit 500. This is because the output signals of the gate circuits 431 to 433 for outputting the pull-up data DQP1 to DQP3 and the output signals of the gate circuits 441 to 443 for outputting the pull-down data DQN1 to DQN3 are branched and connected to many wirings, respectively, as shown in FIG. 4 and thus loads for respective wirings are so heavy. Because a plurality of unit buffers 501 to 507 are provided in the data I/O circuit 500, and many transistors are included in impedance control circuits 511 to 513 connected to the unit buffers 501 to 507, the pull-up data DQP1 to DQP3 and the pull-down data DQN1 to DQN3 are commonly input into the gate electrodes of these many transistors to be supplied to many wirings.

As shown in FIG. 4, the impedance control circuit 511 is commonly provided to the four unit buffers 501 to 504. The impedance control circuit 512 is commonly provided to the two unit buffers 505 and 506. The impedance control circuit 513 is provided to the unit buffer 507. The unit buffers 501 to 507 have the same circuit configuration and are commonly connected to the data I/O terminal 14. In the present embodiment, an impedance per unit buffer is designed at 240Ω. Thus, if the four unit buffers 501 to 504 are activated, the total impedance is 60Ω (=240Ω/4), if the six unit buffers 501 to 506 are activated, the total impedance is 40Ω (=240Ω6) and if the five unit buffers 501 to 504, and 507 are activated, the total impedance is 48Ω (=240Ω/5).

The impedance selection is performed based on the impedance setting code RON supplied from the mode register 53. As shown in FIG. 4, the impedance setting code RON includes a first setting bit 40T and a second setting bit 48T. The first setting bit 40T is supplied to the NAND gate circuits 432 and 442, and the second setting bit 48T is supplied to the NAND gate circuits 433 and 443. Consequently, when the first setting bit 40T is at a high level, the pull-up data DQP2 and the pull-down data DQN2 are enabled and the two unit buffers 505 and 506 are activated via the impedance control circuit 512. When the second setting bit 48T is at a high level, the pull-up data DQP3 and the pull-down data DQN3 are enabled and the unit buffer 507 is activated via the impedance control circuit 513. On the other hand, the value of the impedance setting code RON does not affect the pull-up data DQP1 and the pull-down data DQN1 and thus the four unit buffers 501 to 504 are activated irrespective of the impedance setting code RON.

Figure 6:
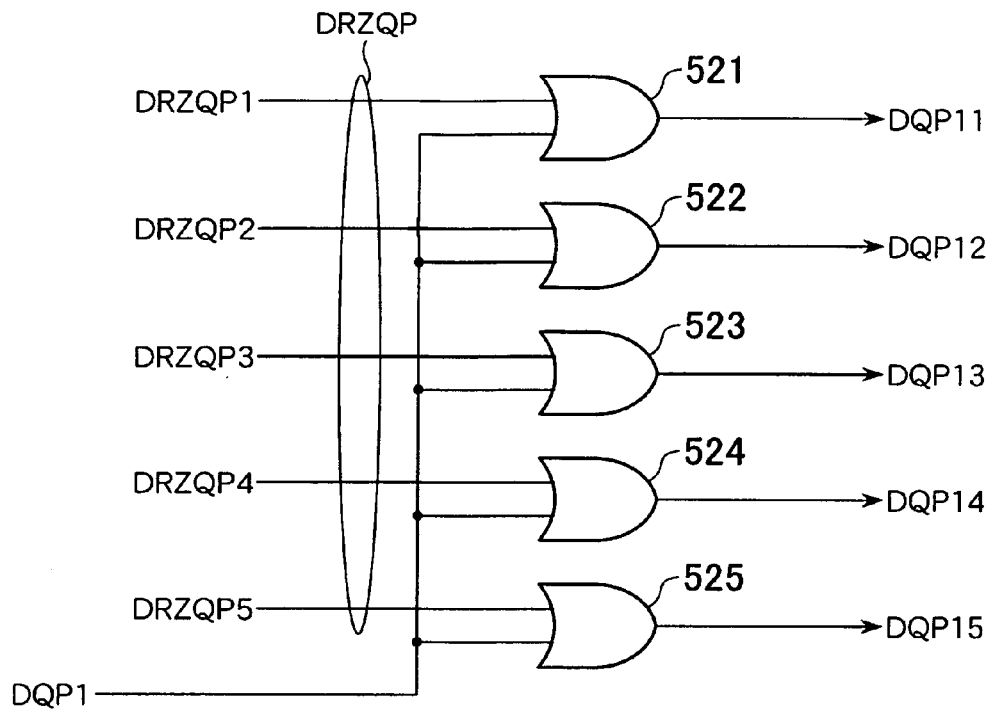
FIG. 6 is a circuit diagram of an impedance control circuit 511.
Figure 6:
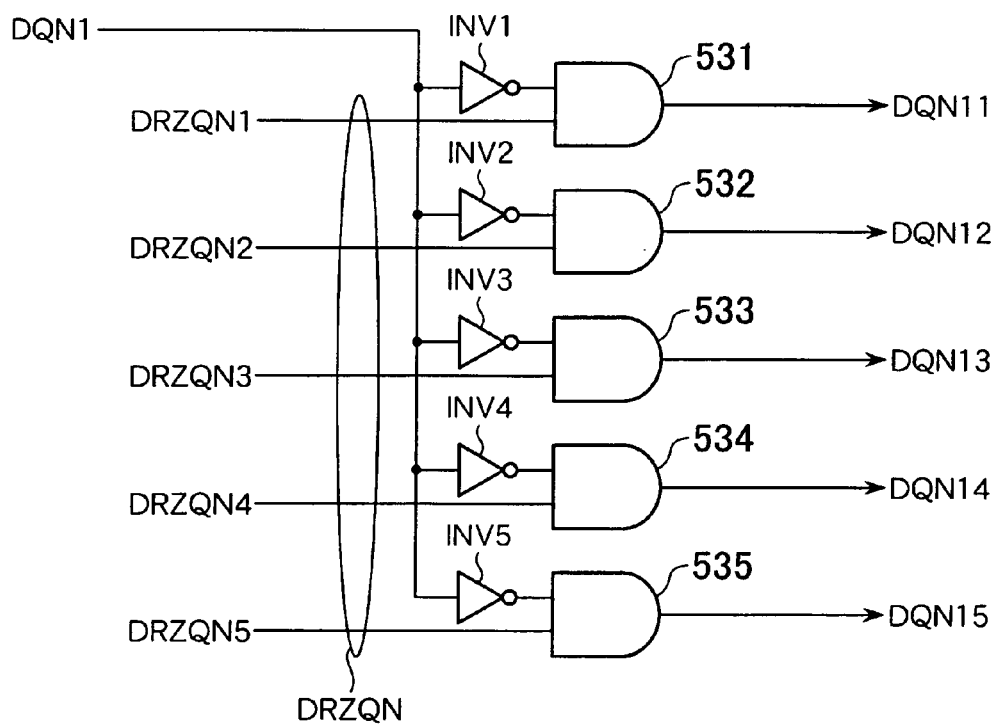

FIG. 6 is a circuit diagram of the impedance control circuit 511.

As shown in FIG. 6, the impedance control circuit 511 is configured of five OR gate circuits 521 to 525 (pull-up logic circuits) and five AND gate circuits 531 to 535 (pull-down logic circuits). The gate OR circuits 521 to 525 are commonly supplied with the pull-up data DQP1 from the control circuit unit 400 and are supplied with bits DRZQP1 to DRZQP5 of a pull-up impedance adjustment code DRZQP, respectively. On the other hand, the AND gate circuits 531 to 535 are supplied with the signals obtained by inverting the pull-down data DQN1 from the control circuit unit 400 by inverters INV1 to INV5, respectively, and are supplied with bits DRZQN1 to DRZQN5 of a pull-down impedance adjustment code DRZQN, respectively. The pull-up impedance adjustment code DRZQP and the pull-down impedance adjustment code DRZQN configure the impedance code ZQCODE, and are supplied from the calibration circuit 66 shown in FIG. 1.

Pull-up data DQP11 to DQP15 as the outputs of the OR gate circuits 521 to 525 and pull-down data DQN11 to DQN15 as the outputs of the AND gate circuits 531 to 535 are commonly supplied to the unit buffers 501 to 504 as shown in FIG. 4.

In this way, because the impedance control circuit 511 is provided with the inverters INV1 to INV5 for inverting the pull-down data DQN1, the pull-up data DQP11 to DQP15 and the pull-down data DQN11 to DQN15 are both in-phase signals. In other words, the pull-up data and the pull-down data which are converted to reverse phase by the level converting circuits 410 and 420 in the control circuit unit 400 are returned to in-phase in the data I/O circuit 500.

The impedance control circuit 512 is supplied with the pull-up data DQP2 and the pull-down data DQN2, and then generated pull-up data DQP21 to DQP25 and pull-down data DQN21 to DQN25 are commonly supplied to the unit buffers 505 and 506. Similarly, the impedance control circuit 513 is supplied with the pull-up data DQP3 and the pull-down data DQN3, and then generated pull-up data DQP31 to DQP35 and pull-down data DQN31 to DQN35 are supplied to the unit buffer 507. In the present invention, the impedance control circuits 511 to 513 may be each called "first control circuit unit."

Figure 7:
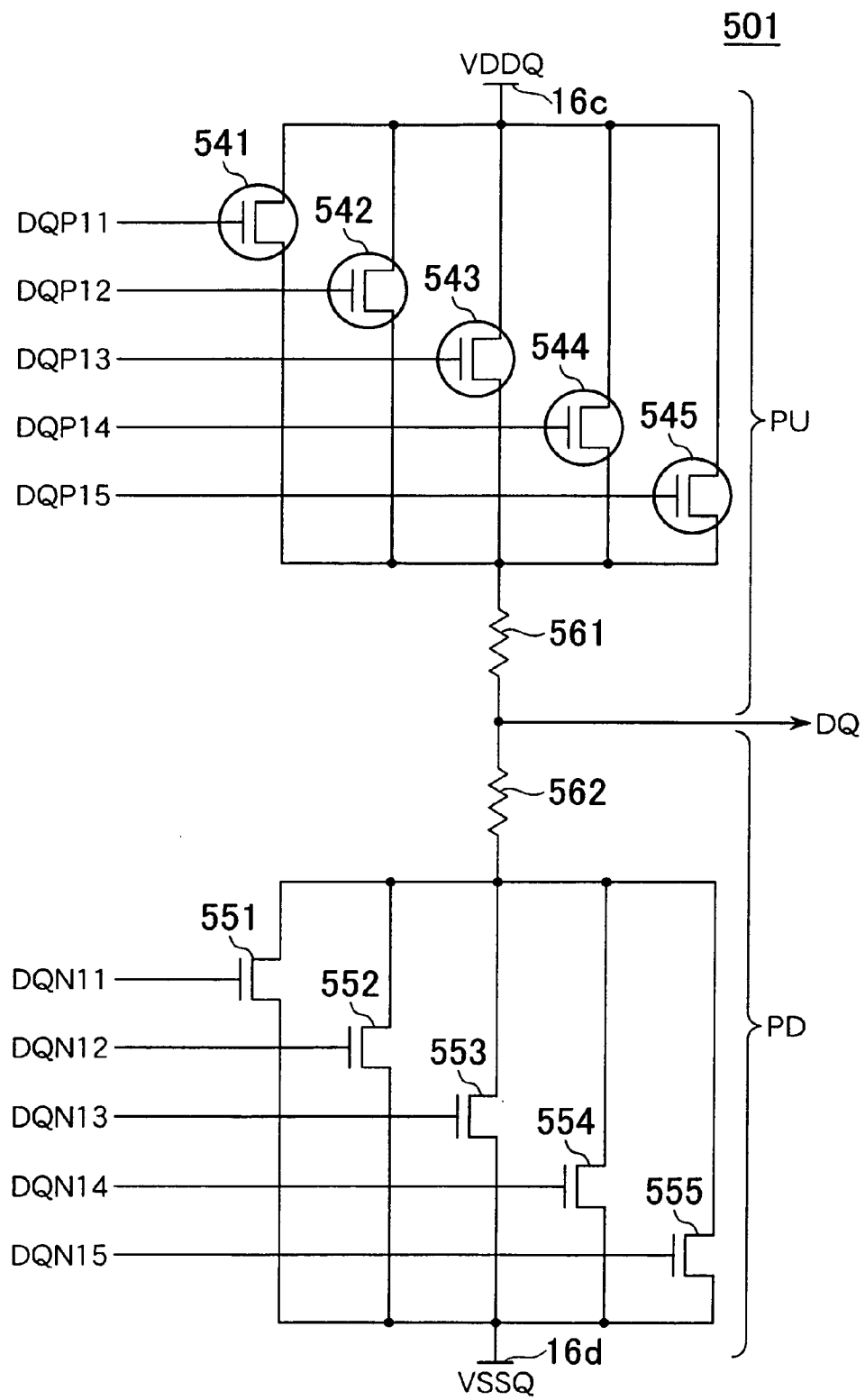
FIG. 7 is a circuit diagram of a unit buffer 501.

FIG. 7 is a circuit diagram of the unit buffer 501.

As shown in FIG. 7, the unit buffer 501 includes five P-channel MOS transistors 541 to 545 connected in parallel, and five N-channel MOS transistors 551 to 555 connected in parallel. Sources of the P-channel MOS transistors 541 to 545 are connected to the VDDQ line 16c and sources of the N-channel MOS transistors 551 to 555 are connected to the VSSQ line 16d. Resistors 561 and 562 are connected in series between the transistors 541 to 545 and the transistors 551 to 555. The connection point between the resistors 561 and 562 is connected to the data I/O terminal 14.

Gate electrodes of the transistors 541 to 545 are supplied with the pull-up data DQP11 to DQP15, respectively. Gate electrodes of the transistors 551 to 555 are supplied with the pull-down data DQN11 to DQN15, respectively. Thus, the ten transistors included in the unit buffer 501 are independently ON/OFF-controlled by ten pieces of the data DQP11 to DQP15 and the data DQN11 to DQN15.

The transistors 541 to 545 and the resistor 561 included in the unit buffer 501 configure a pull-up circuit PU. The transistors 551 to 555 and the resistor 562 included in the unit buffer 501 configure a pull-down circuit PD. The pull-up circuit PU and the pull-down circuit PD are designed at 240Ω while being in conduction. However, since an ON resistance of the transistors varies depending on a manufacturing process condition and varies due to an environment temperature or power supply voltage during operation, a desired impedance cannot be necessarily obtained. Therefore, in order to actually set the impedance at 240Ω, the number of transistors to be turned on needs to be adjusted. A parallel circuit formed of multiple transistors is used therefor.

In order to finely and widely adjust the impedance, the transistors configuring the parallel circuit are preferably different from each other in W/L ratio (gate width/gate length ratio), and the W/L ratios thereof are particularly preferably weighted by the power of 2. In consideration of the point, in the present embodiment, when the W/L ratio of the transistor 541 is set at 1 WLp, the W/L ratios of the transistors 542 to 545 are set at 2 WLp, 4 WLp, 8 WLp and 16 WLp, respectively. Thereby, the transistor turned-on by the pull-up impedance control code DRZQP is appropriately selected so that the ON resistance of the pull-up circuit PU can be fixed at nearly 240Ω irrespective of a variation due to a manufacturing condition, a change in temperature or the like.

Similarly, it is particularly preferable that the W/L ratios of the transistors 551 to 555 are also weighted by the power of 2 like the transistors 541 to 545. Specifically, when the W/L ratio of the transistor 551 is set at 1 WLn, the W/L ratios of the transistors 552 to 555 may be set at 2 WLn, 4 WLn, 8 WLn and 16 WLn, respectively. Thereby, the transistor which is turned-on by the pull-down impedance control code DRZQN is appropriately selected so that the ON resistance of the pull-down circuit PD can be fixed at nearly 240Ω irrespective of a variation due to a manufacturing condition, a change in temperature or the like.

Other unit buffers 502 to 507 have the same circuit structure as the unit buffer 501 illustrated in FIG. 7.

The circuits included in the data I/O circuit 500, that is, the impedance control circuits 511 to 513 and the unit buffers 501 to 507, all operate at the voltage between the external power supply potential VDDQ and the ground potential VSSQ. The pull-up data and the pull-down data are propagated in the in-phase state in the data I/O circuit 500, thereby reducing a skew of the read data DQ. Since a power supply noise may occurs due to the propagation of the in-phase signals but the VDDQ line 16c and the VSSQ line 16d are designed to have a lower impedance than the VDD line 16a and the VSS line 16b as described above, a noise is difficult to occur. Furthermore because the VDDQ line 16c and the VSSQ line 16d are not connected to the VDD line 16a and the VSS line 16b in the chip, the occurred noise is less likely to propagate to other internal circuits.

Figure 8:
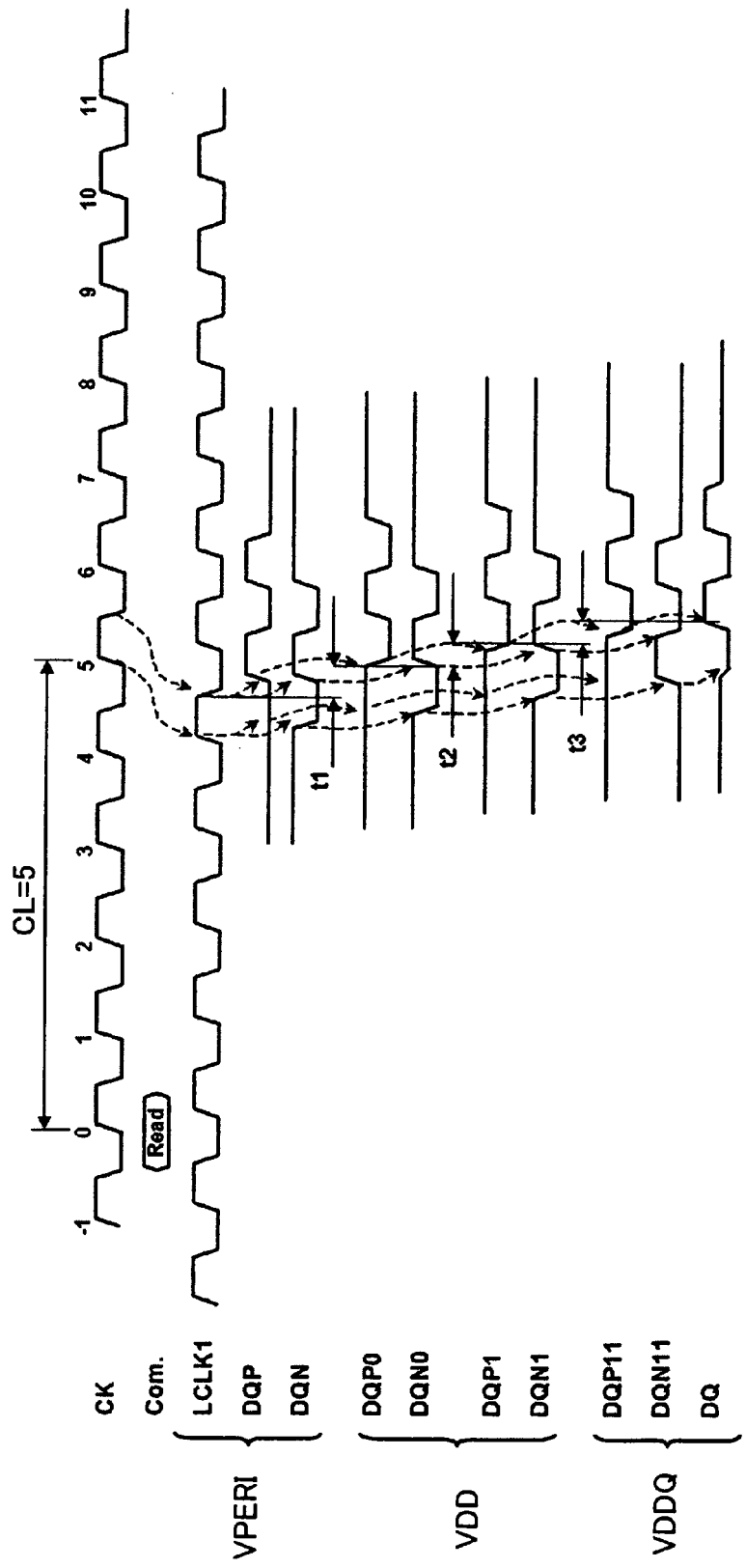
FIG. 8 is a timing chart for explaining an operation of the semiconductor device 10.

FIG. 8 is a timing chart for explaining the operations of the semiconductor device 10 according to the present embodiment.

In the example of FIG. 8, a CAS latency is set at 5 (CL=5) and a read command READ is issued in synchronization with active edge 0 of the external clock signal CK. An additive latency is zero (AL=0). In this case, the read data DQ starts being output five clock cycles after the read command READ is issued. The pull-up data DQP and the pull-down data DQN for generating the read data DQ are generated in synchronization with the internal clock signal LCLK1 whose phase is advanced ahead of the external clock signal. The amplitudes of the pull-up data DQP and the pull-down data DQN are VPERI and their phases are in-phase as shown in FIG. 8.

The pull-up data DQP and the pull-down data DQN are level-shifted via the circuit block with the power supply of VPERI to be supplied to the circuit block with the power supply of VDD. Time t1 shown in FIG. 8 indicates a signal delay occurring in the circuit block with the power supply of VPERI. The pull-up data DQP0 and DQP1 and the pull-down data DQN0 and DQN1, which are transmitted in the circuit block with the power supply of VDD, are converted to reverse phase.

The pull-up data DQP0 and DQP1 and the pull-down data DQN0 and DQN1 are then supplied to the circuit block with the power supply of VDDQ. Time t2 shown in FIG. 8 indicates a signal delay occurring in the circuit block with the power supply of VDD. The pull-up data DQP11 and the pull-down data DQN11, which are transmitted in the circuit block with the power supply of VDDQ, are converted again to in-phase. The unit buffers 501 to 504 are driven by the pull-up data DQP11 and the pull-down data DQN11 to output the read data DQ. Time t3 shown in FIG. 8 indicates a signal delay occurring in the circuit block with the power supply of VDDQ.

Importantly, the delay times of the pull-up data and the pull-down data coincide with each other in each power supply area.

As described above, according to the present embodiment, since the pull-up data and the pull-down data are propagated in the reverse phase state in the control circuit unit 400 and are supplied to the data I/O circuit 500 while being in reverse-phase, noises are difficult to occur also in the final stage of the control circuit unit 400 which easily serves as noise source.

Figure 9:
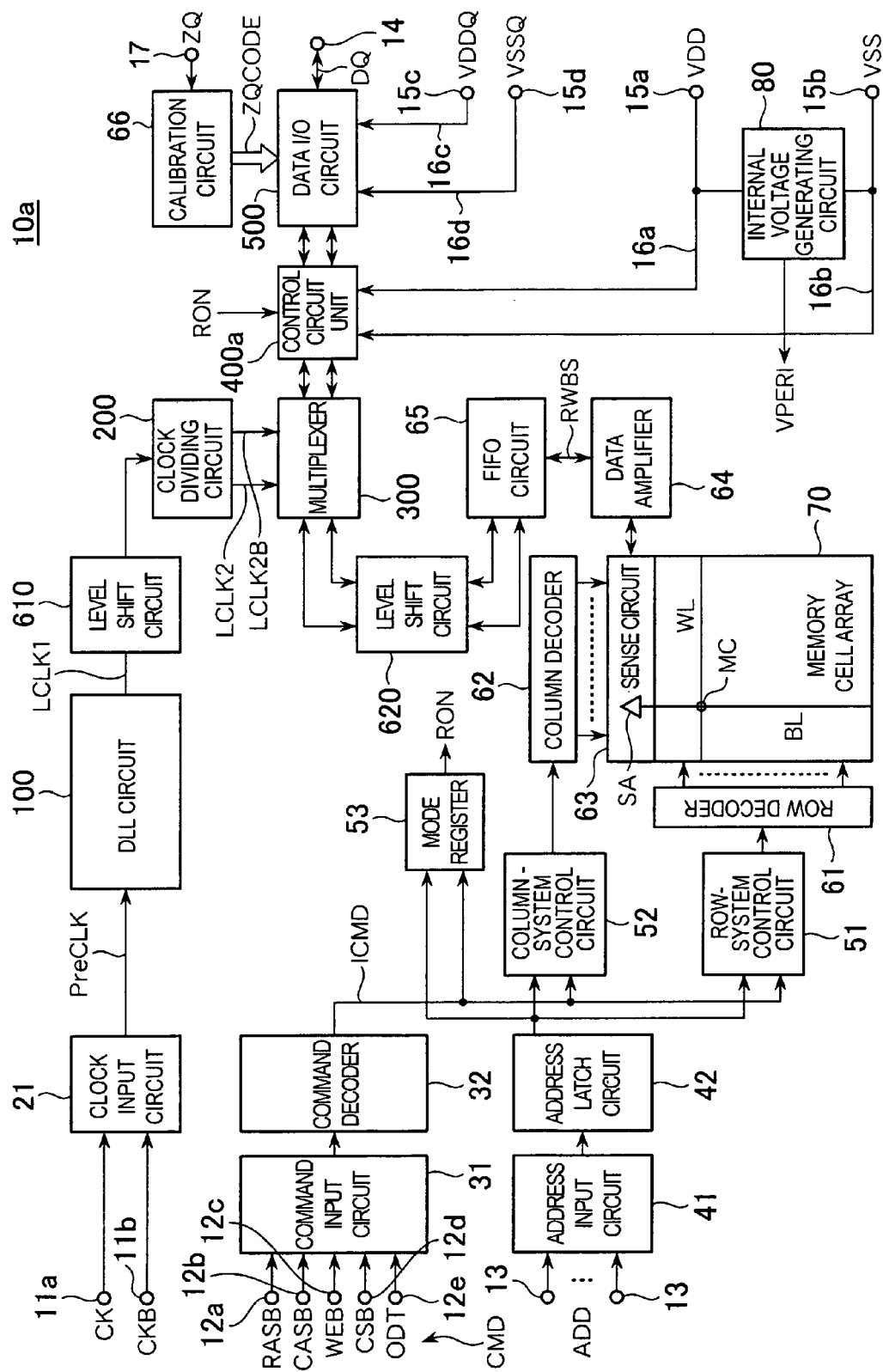
FIG. 9 is a block diagram showing a structure of a semiconductor device 10a according to a second preferred embodiment of the present invention.

FIG. 9 is a block diagram showing a structure of a semiconductor device 10a according to a second embodiment of the present invention.

Figure 10:
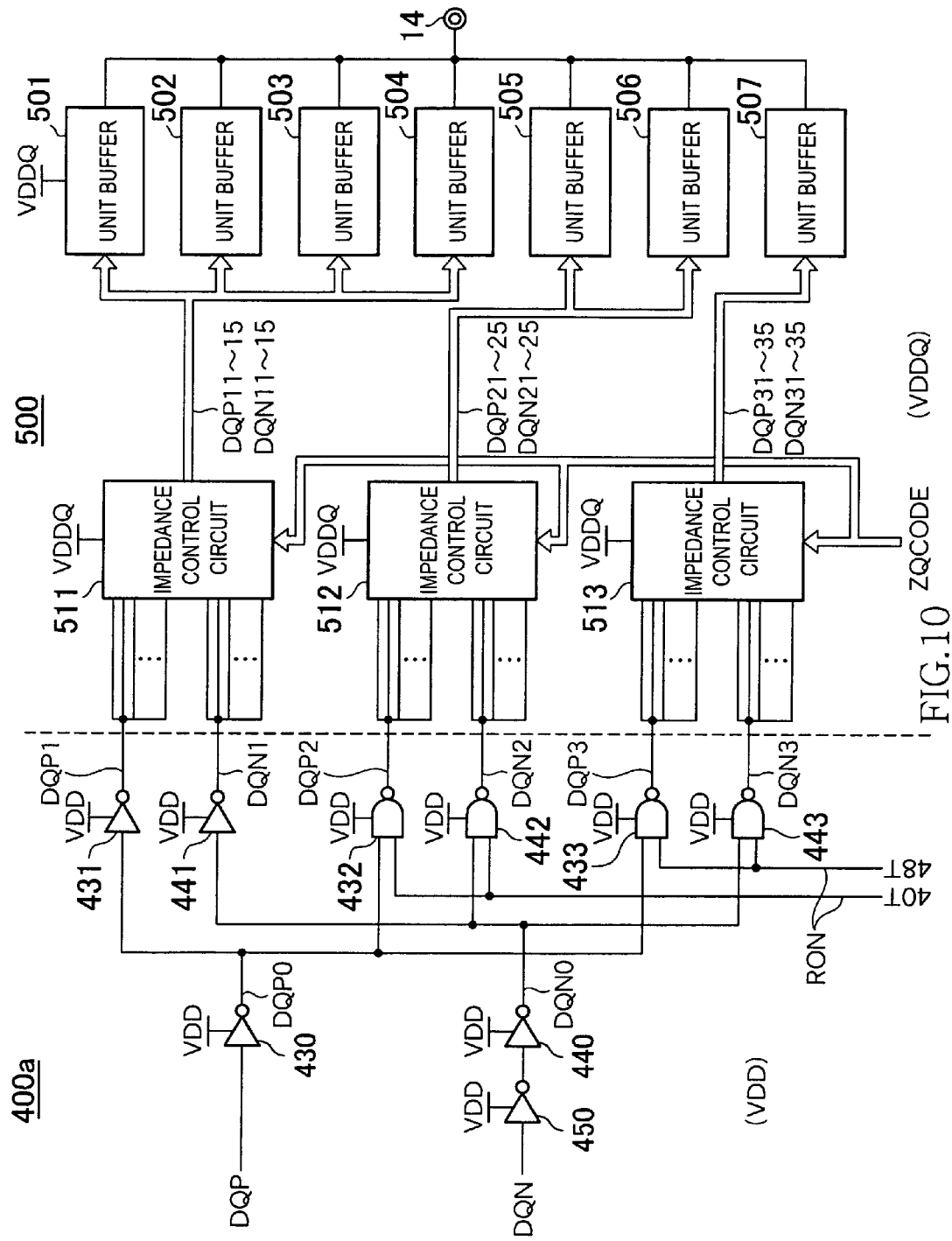
FIG. 10 is a block diagram of a control circuit unit 400a and the data I/O circuit 500.

The semiconductor device 10a according to the present embodiment is added with a level shift circuit 610 between the DLL circuit 100 and the clock dividing circuit 200 and a level shift circuit 620 between the FIFO circuit 65 and the multiplexer 300, and further includes a control circuit unit 400a in place of the control circuit unit 400. The circuit configuration of the level shift circuits 610 and 620 is the same as the circuit configuration of the level converting circuit 410 shown in FIG. 5A. In the present embodiment, since the amplitudes of the pull-up data and the pull-down data are enlarged to the VDD level when the pull-up data and pull-down data are input into the control circuit unit 400a, the level converting circuits 410 and 420 do not need to be provided in the control circuit unit 400a, as shown in FIG. 10. Similar to the first embodiment, the pull-up data and the pull-down data are converted to reverse phase immediately after being input into the control circuit unit 400a, and are supplied to the data I/O circuit 500 in reverse phase. In FIG. 10, the pull-down data DQN is inverted by an inverter 450 thereby to convert the pull-up data DQP0 and the pull-down data DQN0 to reverse phase. The structures of the circuits subsequent to the gate circuits 430 and 440 in the control circuit unit 400a are the same as those in the control circuit unit 400 in FIG. 4.

According to the present embodiment, since the amplitude of the internal clock signal LCLK1 is enlarged from the VPERI level to the VDD level by the level converting circuit 610 and then the complementary internal clock signals LCLK2 and LCLK2B are generated by the clock dividing circuit 200, even when a difference is present between the rise edge conversion speed and the fall edge conversion speed by the level converting circuit, the difference does not overlap on the pull-up data and the pull-down data. Thereby, the data quality of the read data DQ can be enhanced.

It is apparent that the present invention is not limited to the above embodiments, but may be modified and changed without departing from the scope and spirit of the invention.

What is claimed is:

1. A semiconductor device comprising:
a data output terminal;
first and second power supply lines each supplied with a first power supply potential, the first and second power supply lines being separated from each other;
third and fourth power supply lines each supplied with a second power supply potential, the third and fourth power supply lines being separated from each other;
a first driver coupled between the data output terminal and the first power supply line;
a second driver coupled between the data output terminal and the third power supply line;
a first control circuit unit coupled between the first and the third power supply lines, the first control circuit unit supplying the first driver with a first signal and supplying the second driver with a second signal that is in phase to the first signal; and
a second control circuit unit coupled between the second and the fourth power supply lines, the second control circuit unit supplying the first control circuit unit with a third signal that is in phase to the first signal and a fourth signal that is complementary to the first signal, the first control circuit unit receiving the third and the fourth signals, outputting the first signal in response to the third signal, and outputting the second signal in response to the fourth signal,
wherein the first and second power supply lines are connected to different power supply terminals from each other,
the third and fourth power supply lines are connected to different power supply terminals from each other,
the first power supply line is lower in impedance than the second power supply line, and
the third power supply line is lower in impedance than the fourth power supply line.

2. The semiconductor device as claimed in claim 1, wherein the first driver includes a pull-up circuit and the second driver includes a pull-down circuit.

3. The semiconductor device as claimed in claim 1, wherein
the first driver includes a plurality of first transistors connected in parallel between the data output terminal and the first power supply line, and
the second driver circuit includes a plurality of second transistors connected in parallel between the data output terminal and the third power supply line.

4. The semiconductor device as claimed in claim 3, wherein
the first control circuit unit includes a plurality of first logic circuits that controls the first transistors, respectively, and a plurality of second logic circuits that controls the second transistors, respectively, and
the second control circuit unit commonly supplies the third signal to the first logic circuits and commonly supplies the fourth signal to the second logic circuits.

5. A semiconductor device comprising:
a data output terminal;
a pull-up circuit connected between the data output terminal and a first high-potential power supply line;
a pull-down circuit connected between the data output terminal and a first low-potential power supply line;
a first control circuit unit that controls the pull-up circuit and the pull-down circuit, the first control circuit unit operating on a first voltage appearing between the first high-potential power supply line and the first low-potential power supply line; and
a second control circuit unit that controls the first control circuit unit, the second control circuit unit operating on a second voltage appearing between a second high-potential power supply line different from the first high-potential power supply line and a second low-potential power supply line different from the first low-potential power supply line, wherein
the second control circuit unit transmits a first signal that controls the pull-up circuit and a second signal that controls the pull-down circuit in mutually-reverse phase, and supplies the first and second signals in reverse phase to the first control circuit unit, and
the first control circuit unit converts the first and second signals in mutually-reverse phase into in-phase, and transmits and supplies the first and second signals converted into in-phase to the pull-up circuit and the pull-down circuit, respectively, wherein
the first high-potential power supply line and the second high-potential power supply line are connected to mutually-different power supply terminals and are not connected to each other in a chip,
the first low-potential power supply line and the second low-potential power supply line are connected to mutually-different power supply terminals and are not connected to each other in a chip,
the first high-potential power supply line has a lower impedance than the second high-potential power supply line, and
the first low-potential power supply line has a lower impedance than the second low-potential power supply line.

6. The semiconductor device as claimed in claim 5, further comprising a third control circuit unit that controls the second control circuit unit, wherein
the third control circuit unit operates on a third voltage appearing between a third high-potential power supply line different from the second high-potential power supply line and a third low-potential power supply line, and
the third control circuit unit transmits the first and second signals both in phase.

7. The semiconductor device as claimed in claim 6, wherein the third low-potential power supply line is connected to the second low-potential power supply line.

8. The semiconductor device as claimed in claim 6, wherein the second voltage is different in value from the third voltage.

9. The semiconductor device as claimed in claim 8, further comprising a level converting circuit for converting amplitudes of the first and second signals from the third voltage to the second voltage.

10. The semiconductor device as claimed in claim 9, wherein the level converting circuit converts the first and second signals in in-phase having the amplitude of the third voltage into the first and second signals in reverse-phase having the amplitude of the second voltage.

11. The semiconductor device as claimed in claim 9, wherein
the level converting circuit converts the first and second signals in in-phase having the amplitude of the third voltage to the first and second signals in in-phase having the amplitude of the second voltage, and
the second control circuit unit converts the first and second signals from in-phase to reverse phase.

12. The semiconductor device as claimed in claim 6, wherein the third high-potential power supply line is supplied with a stabilized internal power supply potential.

13. A semiconductor device comprising:
a data output terminal;
a first buffer circuit including an adjustable first impedance and coupled to the data output terminal to drive the data output terminal to a first logic level;
a second buffer circuit including an adjustable second impedance and coupled to the data output terminal to drive the data output terminal to a second logic level;
a control circuit unit that generates a first control signal to activate or deactivate the first buffer circuit and a second control signal, that is complementary to the first control signal, to activate or deactivate the second buffer circuit; and
an impedance control circuit receiving the first and the second control signals, supplying a third control signal to the first buffer circuit to adjust the first impedance in response to the first control signal and supplying a fourth control signal to the second buffer circuit to adjust the second impedance in response to the second control signal, the third control signal being in phase to the fourth control signal, wherein
the first buffer circuit is connected between a first high-potential power supply line and the data output terminal,
the second buffer circuit is connected between a first low-potential power supply line and the data output terminal,
the control circuit unit operates on a voltage between a second high-potential power supply line different from the first high-potential power supply line and a second low-potential power supply line different from the first low-potential power supply line,
the first high-potential power supply line and the second high-potential power supply line are connected to mutually-different power supply terminals and are not connected to each other in a chip,
the first low-potential power supply line and the second low-potential power supply line are connected to mutually-different power supply terminals and are not connected to each other in a chip,
the first high-potential power supply line has a lower impedance than the second high-potential power supply line, and
the first low-potential power supply line has a lower impedance than the second low-potential power supply line.

14. The semiconductor device as claimed in claim 13, wherein
the first buffer circuit, when activated, electrically connects the data output terminal to the first high-potential power supply line in response to the third control signal,
the second buffer circuit, when activated, electrically connects the data output terminal to the first low-potential power supply line in response to the fourth control signal,
the impedance control circuit is coupled between the first high-potential power supply line and the first low-potential power supply line.

15. The semiconductor device as claimed in claim 13, wherein
the first buffer circuit includes a plurality of first transistors coupled in parallel between the data output terminal and the first high-potential power supply line, and
the second buffer circuit includes a plurality of second transistors coupled in parallel between the data output terminal and the first low-potential power supply line.

16. The semiconductor device as claimed in claim 15, wherein the first high-potential and the first low-potential power supply lines are respectively supplied with a first and a second power supply voltages and the first power supply voltage is higher than the second power supply voltage.

17. The semiconductor device as claimed in claim 13, further comprising an impedance adjust circuit supplying the impedance control circuit with first and second codes, and wherein the impedance control circuit generates the third control signal in response to the first code and generates the fourth control signal in response to the second code.

* * * * *